(12) United States Patent
Clark et al.

(10) Patent No.: US 7,564,152 B1
(45) Date of Patent: Jul. 21, 2009

(54) HIGH MAGNETOSTRICTION OF POSITIVE MAGNETOSTRICTIVE MATERIALS UNDER TENSILE LOAD

(75) Inventors: Arthur E. Clark, Adelphi, MD (US); James B. Restorff, College Park, MD (US); Marilyn Wun-Fogle, Potomac, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 457 days.

(21) Appl. No.: 11/053,753

(22) Filed: Jan. 31, 2005

Related U.S. Application Data

(60) Provisional application No. 60/543,650, filed on Feb. 12, 2004.

(51) Int. Cl.
*H01L 41/00* (2006.01)
*H02N 2/00* (2006.01)
(52) U.S. Cl. .................................. 310/26; 148/108
(58) Field of Classification Search ............... None
See application file for complete search history.

(56) References Cited

U.S. PATENT DOCUMENTS

| | | | |
|---|---|---|---|
| 3,336,154 A * | 8/1967 | Oberg et al. | 427/8 |
| 3,949,351 A | 4/1976 | Clark et al. | |
| 4,053,331 A | 10/1977 | Graham, Jr. et al. | |
| 4,112,699 A | 9/1978 | Hudson, III et al. | |
| 4,158,368 A | 6/1979 | Clark | |
| 4,308,474 A | 12/1981 | Savage et al. | |
| 4,378,258 A | 3/1983 | Clark et al. | |
| 4,438,509 A | 3/1984 | Butler et al. | |
| 4,748,000 A | 5/1988 | Hayashi et al. | |
| 4,763,030 A | 8/1988 | Clark et al. | |
| 4,904,543 A | 2/1990 | Sakakima et al. | |
| 4,906,879 A | 3/1990 | Clark | |
| 5,039,894 A | 8/1991 | Teter et al. | |
| 5,041,753 A | 8/1991 | Clark et al. | |

(Continued)

OTHER PUBLICATIONS

U.S. Appl. No. 11/274,635, filed Nov. 15, 2005, entitled "Method of Achieving High Transduction under Tension or Compression," joint inventors Arthur E. Clark, Marilyn Wun-Fogle and James B. Restorff.

(Continued)

*Primary Examiner*—John P. Sheehan
(74) *Attorney, Agent, or Firm*—Howard Kaiser

(57) ABSTRACT

An elongate structure having a magnetostrictive material composition is subjected to tensile stress in the longitudinal-axial direction, thereby generally orienting the magnetization of the elongate structure in the longitudinal-axial direction. Electrical current is conducted through the elongate structure and/or through at least one adjacent elongate conductor, thereby generally orienting the magnetization of the elongate structure in the transverse direction, generally in parallel with the transverse direction of the magnetic field concomitant the conduction of current through the elongate structure. The elongate structure magnetostrictively contracts due to the (generally 90°) repositioning of the magnetization of the elongate structure. Examples of inventive configurational variants include: (i) an elongate structure itself conducting current; (ii) a hollow elongate structure accommodating placement therethrough of at least one elongate conductor; (iii) an elongate structure flanked by a pair of elongate conductors conducting current in opposite directions; (iv) plural elongate structures bordering a centralized elongate conductor.

8 Claims, 5 Drawing Sheets

U.S. PATENT DOCUMENTS

| | | |
|---|---|---|
| 5,074,916 A | 12/1991 | Hench et al. |
| 5,168,760 A | 12/1992 | Wun-Fogle et al. |
| 5,201,964 A | 4/1993 | Savage et al. |
| 5,315,881 A | 5/1994 | Savage et al. |
| 5,347,872 A | 9/1994 | Clark |
| 5,460,866 A | 10/1995 | Kabacoff et al. |
| 5,493,921 A | 2/1996 | Alasafi et al. |
| 5,530,312 A | 6/1996 | Teter et al. |
| 5,600,239 A | 2/1997 | Hathaway et al. |
| 5,693,154 A | 12/1997 | Clark et al. |
| 5,958,154 A | 9/1999 | O'Handley et al. |
| 6,026,847 A | 2/2000 | Reinicke et al. |
| 6,139,648 A | 10/2000 | Wun-Fogle et al. |
| 6,176,943 B1 | 1/2001 | Wun-Fogle et al. |
| 6,300,855 B1 | 10/2001 | Clark et al. |
| 6,364,221 B1 | 4/2002 | Czimmek |
| 6,489,695 B1 | 12/2002 | Wun-Fogle et al. |
| 6,514,358 B1 | 2/2003 | Bartholomeusz et al. |
| 6,533,257 B1 | 3/2003 | Clark |
| 6,737,951 B1 | 5/2004 | Decristofaro et al. |
| 6,811,093 B2 | 11/2004 | Rado |
| 2003/0010405 A1 | 1/2003 | Clark et al. |

OTHER PUBLICATIONS

"Mechanical Properties of Magnetostrictive Iron-Gallium Alloys," R. A. Kellogg, A. M. Russell, T. A. Lograsso, A. B. Flatau, A. E. Clark, M. Wun-Fogle, *Proceedings of the SPIE's 10th Annual International Symposium on Smart Structures and Materials*, Mar. 2-6, 2003, San Diego, CA, Paper #5053-70, vol. 5053, pp. 534-543.

"Large Magnetostriction in Directionally Solidified FeGa and FeGaAl Alloys," N. Srisukhumbowornchai and S. Guruswamy, *Journal of Applied Physics*, vol. 90, No. 11, Dec. 1, 2001, pp. 5680-5688.

"Magnetostrictive Properties of Fe-Ga Alloys Under Large Compressive Stresses," A. E. Clark, J. B. Restorff, M. Wun-Fogle, T. A. Lograsso, The 2000 IEEE International Magnetics Conference, Apr. 9-13, 2000, *Digest Intermag 2000*, BS-12, Apr. 8, 2000, 2 pages.

"Magnetostrictive Galfenol/Alfenol Single Crystal Alloys Under Large Compressive Stresses," A. E. Clark, M. Wun-Fogle, J. B. Restorff, T. A. Lograsso, D. L. Schlagel, Actuator 2000, 7th International Conference On New Actuators, Jun. 19-21, 2000, pp. 111-115.

*Phase Diagrams of Binary Iron Alloys*, H. Okamoto, Editor, ASM International, Materials Park, OH, Oct. 1993, pp. 147-151.

*Phase Diagrams of Binary Beryllium Alloys*, H. Okamoto and L. E. Tanner, Editors, ASM International, Metals Park, Ohio, Dec. 1987, pp. 81-96.

"Extraordinary Magnetoelasticity and Lattice Softening in bcc Fe-Ga Alloys," A. E. Clark, K. B. Hathaway, M. Wun-Fogle, J. B. Restorff, T. A. Lograsso, V. M. Keppens, G. Petculescu, R. A. Taylor, *Journal of Applied Physics*, vol. 93, No. 10, May 15, 2003, pp. 8621-8623.

"Magnetostriction and Magnetization of Ternary Fe-Ga-X Alloys (X=Sn, Ni, Mo)," J. B. Restorff, M. Wun-Fogle, A. E. Clark, T. A. Lograsso, A. R. Ross, D. L. Schlagel, Abstracts, 46th Conference on Magnetism & Magnetic Materials, Seattle, Washington, Nov. 12-16, 2001, pp. 274-275.

"Mechanical Properties of Magnetostrictive Iron-Gallium Alloys," R. A. Kellogg, A. M. Russell, T. A. Lograsso, A. B. Flatau, A. E. Clark, M. Wun-Fogle, SPIE's 10th Annual International Symposium on Smart Structures and Materials, San Diego, California, Mar. 2-6, 2003, paper #5053-70, 10 pages.

"Magnetostrictive Alfenol/Galfenol Alloys Under Large Compressive Stresses," Arthur E. Clark, Marilyn Wun-Fogle, James B. Restorff, Thomas A. Lograsso, Deborah L. Schlagel, Presentation, Actuator 2000, Jun. 19-21, 2000, 17 pages.

"Fe-Ga/Pb($Mg_{1/3}NB_{2/3}$)$O_3$-$PbTiO_3$ Magnetoelectric Laminate Composites," Shuxiang Dong, Junyi Zhai, Naigang Wang, Feiming Bai, JieFang Li8, D. Viehland, *Applied Physics Letters*, vol. 87, pp. 222504-1 to 222504-3, Nov. 22, 2005.

"Effect of Quenching on the Magnetostriction of $Fe_{1-x}Ga_x$ (0.13 < x < 0.21)," Arthur E. Clark, Marilyn Wun-Fogle, James B. Restorff, Thomas A. Lograsso, Amy R. Ross, James R. Cullen, Abstracts, The 8th Joint MMM-Intermag Conference, San Antonio, Texas, Jan. 7-11, 2001, p. 284.

"Effect of Quenching on the Magnetostriction of $Fe_{1-x}Ga_x$ (0.13 <x < 0.21)," Arthur E. Clark, Marilyn Wun-Fogle, James B. Restorff, Thomas A. Lograsso, Amy R. Ross, James R. Cullen, The 8th Joint MMM-Intermag Conference, Jan. 7-11, San Antonio, Texas, Jan. 7-11, 2001, *IEEE Transactions on Magnetics*, vol. 37, No. 4, Jul. 2001, pp. 2678-2680.

"Structural Studies of $Fe_{0.81}Ga_{0.19}$ by Reciprocal Space Mapping," D. Viehland, J. F. Li, T. A. Lograsso, A Ross, Manfred Wuttig, *Applied Physics Leters*, vol. 81, No. 17, Oct. 21, 2002, pp. 3185-3187.

"Magnetism, Elasticity, and Magnetostriction of FeCoGa Alloys," Liyang Dai, James Cullen, Manfred Wuttig, T. Lograsso, Eckhard Quandt, *Journal of Applied Physics*, vol. 93, No. 10, May 15, 2003, pp. 8627-8629.

"Influence of Crystal Chemistry on Magnetoelastic in Fe-Ga A," T. A. Lograsso, D. L. Schlagel, A. R. Ross, 3 pages printed out online on Mar. 2, 2004 at http://216.239.41.104/search?q=cache:tVoclaexwiIJ:www.metcer.ameslab.gov/pdf%2520files.

"Influence of Ordering on the Magnetostriction of Fe-27.5 at. % Ga Alloys," N. Srisukhumbowornchai and S Guruswamy, *Journal of Applied Physics*, vol. 92, No. 9, pp. 5371-5379, Nov. 1, 2002.

Office Action, U.S. Appl. No. 10/182,095, mail-date Aug. 25, 2003, 12 pages.

PCT International Preliminary Examination Report, PCT/US01/02795, 10 pages.

PCT International Search Report, PCT/US01/02795, 7 pages.

"High Magnetomechanical Coupling of Transduction Elements under Tension," J. B. Restorff, M. Wun-Fogle, A. E. Clark, 11th CF/DRDC International Meeting on Naval Applications of Materials Technology, Dartmouth, Nova Scotia, Jun. 7-9, 2005, 5 pages.

"Development and Modeling of Iron-Gallium Alloys," Rick Allen Kellogg, cover sheet (1 page) plus table of contents (1 page) plus 117 pages (cover sheet states: "Development and modeling of iron-gallium alloys . . . by Rick Allen Kellogg . . . A thesis submitted to the graduate faculty in partial fulfillment of the requirements for the degree of Doctor of Philosophy . . . Major: Engineering Mechanics . . . Major Professor: Alison Flatau . . . Iowa State University . . . Ames, Iowa . . . 2003").

U.S. Appl. No. 60/882,259, filed Dec. 28, 2006, entitled "Fe-X (X=Al, Ga) Bimetallic Strips for Energy Harvesting, Actuating and Sensing," joint inventors Arthur E. Clark, Marilyn Wun-Fogle and James B. Restorff.

U.S. Appl. No. 60/832,007, filed Jul. 11, 2006, entitled "Galfenol Steel," joint inventors Arthur E. Clark, Marilyn Wun-Fogle and Thomas A. Lograsso.

U.S. Appl. No. 11/296,726, filed Nov. 29, 2005, entitled "Magnetostrictive Materials, Devices and Methods Using High Magnetostriction, High Strength FeGa and FeBe Alloys," joint inventors Arthur E. Clark, Marilyn Wun-Fogle, James B. Restorff, Thomas A. Lograsso and Rick Allen Kellogg.

U.S. Appl. No. 11/058,710, filed Feb. 11, 2005, entitled "Preparation of Positive Magnetostrictive Materials for Use under Tension," joint inventors Arthur E. Clark, Marilyn Wun-Fogle and James B. Restorff.

U.S. Appl. No. 11/822,778, filed Jul. 10, 2007, entitled "Galfenol Steel," joint inventors Arthur E. Clark, Marilyn Wun-Fogle and Thomas A. Lograsso.

International Application filed under the Patent Cooperation Treaty (PCT), International Application No. PCT/US2007/015688, international filing date Jul. 10, 2007, title "Galfenol Steel," joint inventors Arthur E. Clark, Marilyn Wun-Fogle and Thomas A. Lograsso (18 pages of text and 3 sheets of drawings).

"Tensile Strength and Non-axial Auxetic Properties of Fe-Ga Alloys," R.A. Kellogg, A.M. Russell, T.A. Lograsso, A.B. Flatau, A.E. Clark, and M. Wun-Fogle, U.S. Navy Workshop on Acoustic Tranduction Materials and Devices, State College, Pennsylvania, May 6-8, 2003 (1 page).

"Magnetostrictive and Elastic Properties of Single Crystal $Fe_{100-x}Ga_x$ (5.8 < x < 28.8)," A.E. Clark, M. Wun-Fogle, J.B. Restorff, T.A. Lograsso, and G. Petculescu, U.S. Navy Workshop on Acoustic Tranduction Materials and Devices, State College, Pennsylvania, May 6-8, 2003 (1 page).

"Piezomagnetic Properties of Polycrystalline Galfenol Transduction Elements," M. Wun-Fogle, A.E. Clark, J.B. Restorff, and T.A. Lograsso, U.S. Navy Workshop on Acoustic Tranduction Materials and Devices, State College, Pennsylvania, May 6-8, 2003 (1 page).

U.S. Appl. No. 60/543,650, filed Feb. 12, 2004, entitled "Preparation of Positive Magnetostrictive Materials for Operation under Tension," joint inventors Arthur E. Clark, James B. Restorff and Marilyn Wun-Fogle.

U.S. Appl. No. 11/007,953, filed Dec. 7, 2004, entitled "Magnetostrictive Materials, Devices and Methods using High Magnetostriction, High Strength Fe-Ga Alloys," joint inventors Arthur E. Clark, James B. Restorff and Marilyn Wun-Fogle.

U.S. Appl. No. 10/182,095, filed Jul. 24, 2002, entitled "Magnetostrictive Materials, Devices and Methods using High Magnetostriction, High Strength Fe-Ga Alloys," joint inventors Arthur E. Clark, James B. Restorff and Marilyn Wun-Fogle.

U.S. Appl. No. 60/178,615, filed Jan. 28, 2000, entitled "Strong, Ductile, and Low Field Magnetostrictive Alloys," joint inventors Arthur E. Clark, James B. Restorff and Marilyn Wun-Fogle.

U.S. Appl. No. 10/750,634, filed Dec. 24, 2003, entitled "Magnetostrictive Materials, Devices and methods using High Magnetostriction, High Strength Fe-Ga Alloys," joint inventors Arthur E. Clark, James B. Restorff and Marilyn Wun-Fogle.

"Tensile Properties of Magnetostrictive Iron-Gallium Alloys," R. A. Kellogg, A. M. Russell, T. A. Lograsso, A. B. Flatau, A. E. Clark and M. Wun-Fogle, *Acta Materialia*, vol. 52, pp. 5043-5050 (available online Aug. 25, 2004 at www.sciencedirect.com).

"Extraordinary Magnetoelasticity and Lattice Softening in b.c.c. Fe-Ga Alloys," A. E. Clark, K. B. Hathaway, M. Wun-Fogle, J. B. Restorff, T. A. Lograsso, V. M. Keppens, G. Petculescu, and R.A. Taylor, *Journal of Applied Physics*, vol. 93, No. 10, pp. 8621-8623 (May 15, 2003).

"Texture and Grain Morphology Dependencies of Saturation Magnetostriction in Rolled Polycrystalline $Fe_{83}Ga_{17}$," R. A. Kellogg, A. B. Flatau, A. E. Clark, M. Wun-Fogle, and T. A. Lograsso, *Journal of Applied Physics*, vol. 93, No. 10, pp. 8495-8497 (May 15, 2003).

"Structural Transformations in Quenched Fe-Ga Alloys," T. A. Lograsso, A. R. Ross, D. L. Schlagel, A. E. Clark and M. Wun-Fogle, *Journal of Alloys and Compounds*, vol. 350, pp. 95-101 (Feb. 17, 2003).

"Magnetostrictive Properties of Galfenol Alloys under Compressive Stress," A. E. Clark, M. Wun-Fogle, J. B. Restorff, and T. A. Lograsso, *Materials Transactions*, vol. 43, No. 5, pp. 881-886, The Japan Institute of Metals, Special Issue on Smart Materials—Fundamentals and Applications (May 2002).

"Temperature and Stress Dependencies of the Magnetic and Magnetostrictive Properties of $Fe_{81}Ga_{19}$," R. A. Kellogg, A. Flatau, A. E. Clark, M. Wun-Fogle and T. A. Lograsso, *Journal of Applied Physics*, vol. 91, No. 10, pp. 7821-7823 (May 15, 2002).

"Magnetostriction of Ternary Fe-Ga-X Alloys (X=Ni, Mo, Sn, Al)," J. B. Restorff, M. Wun-Fogle, A. E. Clark, T. A. Lograsso, A. R. Ross, and D. L. Schlagel, *Journal of Applied Physics*, vol. 91, No. 10, pp. 8225-8227 (May 15, 2002).

"Effect of Quenching on the Magnetostriction of $Fe_{1-x}Ga_x$ (0.13 < x < 0.21)," A. E. Clark, M. Wun-Fogle, J. B. Restorff, T. A. Lograsso and J. R. Cullen, *IEEE Transactions on Magnetics*, vol. 37, No. 4, pp. 2678-2680 (Jul. 2001).

"Magnetoelasticity of Fe-Ga and Fe-Al Alloys," J. R. Cullen, A. E. Clark, M. Wun-Fogle, J. B. Restorff and T. A. Lograsso, *Journal of Magnetism and Magnetic Materials*, vols. 226-230, part 1, pp. 948-949 (May 2001).

"Magnetostrictive Properties of Body-Centered Cubic Fe-Ga and Fe-Ga-Al Alloys," Arthur E. Clark, James B. Restorff, Marilyn Wun-Fogle, Thomas A. Lograsso and Deborah L. Schlagel, *IEEE Transaction on Magnetics*, vol. 36, No. 5, pp. 3238-3240 (Sep. 2000).

"Magnetostrictive Galfenol/Alfenol Single Crystal Alloys Under Compressive Stresses," A. E. Clark, M. Wun-Fogle, J. B. Restorff, and T. A. Lograsso, *Proceedings of Actuator 2000*, 7th International Conference on New Actuators, Bremen, Germany, Jun. 19-21, 2000, pp. 111-115.

"Strong, Ductile, and Low-Field-Magnetostrictive Alloys Based on Fe-Ga," S. Guruswamy, N. Srisukhumbowornchai, A. E. Clark, J. B. Restorff, and M. Wun-Fogle, *Scripta Materialia*, vol. 43, issue 3, pp. 239-244 (Jul. 20, 2000).

"Quasi-Static Transduction Characterization of Galfenol," Rick A. Kellogg, Alison Flatau, Arthur E. Clark, Marulyn Wun-Fogle, and Thomas Lograsso, *Proceedings of IMECE 2003*, 2003 ASME International Mechanical Engineering Congress, Washington, D.C., Nov. 15-21, 2003, pp. 1-8.

"Magnetostriction of Stress Annealed Fe-Ga-Al and Fe-Ga Alloys under Compressive and Tensile Stress," M. Wun-Fogle, J. B. Restorff, and A. E. Clark, SPIE Eleventh Annual International Symposium on Smart Structures and Materials, Mar. 14-18, 2004, San Diego, California, *Proceedings of SPIE*, vol. 5387, pp. 468-475 (Jul. 2004; published online Nov. 9, 2004).

"Hysteresis and Magnetostriction of $Tb_xDy_yHo_{1-x-y}Fe_{1.95}$ [112] Dendritic Rods," M. Wun-Fogle, J. B. Restorff, and A. E. Clark, *Journal of Applied Physics*, vol. 85, No. 8, pp. 6253-6255 (Apr. 15, 1999).

"Magnetization and Magnetostriction of $Tb_{1-x}Dy_xZn$ Single Crystals," J. R. Dullen, M. Wun-Fogle, J. P. Teter, J. B. Restorff, and A. E. Clark, *Journal of Applied Physics*, vol. 85, No. 8, pp. 6250-6252 (Apr. 15, 1999).

"Temperature and Stress Dependencies of the Magnetostriction in Ternary and Quaternary Terfenol Alloys," J. B. Restorff, M. Wun-Fogle, and A. E. Clark, *Journal of Applied Physics*, vol. 87, No. 9, pp. 5786-5788 (May 1, 2000).

"Magnetostriction and Elasticity of Body Centered Cubic $Fe_{100-x}Be_x$ Alloys," A. E. Clark, M. Wun-Fogle, J. B. Restorff, T. A. Lograsso, and G. Petculescu, *Journal of Applied Physics*, vol. 95, No. 11, pp. 6942-6944 (Jun. 1, 2004).

"Temperature Dependence of the Magnetic Anisotropy and Magnetostriction of $Fe_{100-x}Ga_x$ (x=8.6, 16,6, 28.5)," A. E. Clark, M. Wun-Fogle, J. B. Restorff, K. W. Dennis, T. A. Lograsso, and R. W. McCallum, *Journal of Applied Physics*, vol. 97, issue 10, pp. 10M316-1 to 10M316-3 (published online May 16, 2005).

"Magnetic Field Dependence of Galfenol Elastic Properties," G. Petculescu, K. B. Hathaway, T. A. Lograsso, M. Wun-Fogle, and A. E. Clark, *Journal of Applied Physics*, vol. 97, issue 10, pp. 10M315-1 to 10M315-3 (published online May 16, 2005).

"Stress Annealing of Fe-Ga Transduction Alloys for Operation under Tension and Compression," M. Wun-Fogle, J. B. Restorff, A. E. Clark, Erin Dreyer, Eric Summers, *Journal of Applied Physics*, vol. 97, issue 10, pp. 10M301-1 to 10M301-3 (published online May 13, 2005).

"Domain Structure of As-Cast and Annealed FeSiB Amorphous Wires," M. Letcher, G. A. Jones, D. G. Lord, M. Wun-Fogle, and H. T. Savage, *Journal of Applied Physics*, vol. 69, No. 8, pp. 5331-5333 (Apr. 15, 1991).

"Magnetostriction of Terfenol-D Heat Treated under Compressive Stress," M. Wun-Fogle, J. B. Restorff, K. Leung, and J. R. Cullen, *IEEE Transactions on Magnetics*, vol. 35, No. 5, pp. 3817-3819 (Sep. 1999).

"Structure of Melt-Spun Fe-Ga-Based Magnetostrictive Alloys," S. F. Cheng, B. N. Das, M. Wun-Fogle, P. Lubitz, and A. E. Clark, *IEEE Transactions on Magnetics*, vol. 38, No. 5, pp. 2838-2840 (Sep. 2002).

"Structural Fe-Based Alloys with High Magnetostriction," A. E. Clark, slide presentation at the Galfenol Workshop ("Galfenol Day 2004"), University of Maryland, College Park, Maryland, Jan. 29, 2004, available online at the Galfenol Workshop website, http://www.aerosmart.umd.edu/Galfenol/index.html, 51 pages printed out on or about Nov. 4, 2005.

"Stress Annealing of Galfenol for Operation under Compression and Tension," Marilyn Wun-Fogle, James Restorff, and Arthur Clark, slide presentation at the Galfenol Workshop ("Galfenol Day 2004"), University of Maryland, College Park, Maryland, Jan. 29, 2004, available online at the Galfenol Workshop website, http://www.aerosmart.umd.edu/Galfenol/index.html, 15 pages printed out on or about Nov. 4, 2005.

"Structure of Melt-Spun Fe-Ga Based Magnetostrictive Alloys," S. F. Cheng, B. N. Das, M. Wun-Fogle, P. Lubitz, and A. E. Clark, slide presentation at the Galfenol Workshop ("Galfenol Day 2004"), University of Maryland, College Park, Maryland, Jan. 29, 2004, available online at the Galfenol Workshop website, http://www.aerosmart.umd.edu/Galfenol/index.html, 25 pages printed out on or about Nov. 4, 2005.

"State of the Art of Galfenol Processing," Materials Research Group—Etrema Products, Inc. (EPI), slide presentation at the Galfenol Workshop ("Galfenol Day 2004"), University of Maryland, College Park, Maryland, Jan. 29, 2004, available online at the Galfenol Workshop website, http://www.aerosmart.umd.edu/Galfenol/index.html, 38 pages printed out on or about Nov. 4, 2005.

"Magnetization, Magnetic Anisotropy and Magnetostriction of Galfenol Alloys," A. E. Clark, M. Wun-Fogle, and J. B. Restorff, slide presentation at the Galfenol Workshop ("Galfenol Day 2005"), University of Maryland, College Park, Maryland, Feb. 1, 2005, available online at the Galfenol Workshop website, http://www.aerosmart.umd.edu/Galfenol/index.html, 24 pages printed out on or about Nov. 4, 2005.

"Magnetic Field Dependence of Galfenol Elastic Properties," G. Petculescu, K. B. Hathaway, T. A. Lograsso, M. Wun-Fogle, and A. E. Clark, slide presentation at the Galfenol Workshop ("Galfenol Day 2005"), University of Maryland, College Park, Maryland, Feb. 1, 2005, available online at the Galfenol Workshop website, http://www.aerosmart.umd.edu/Galfenol/index.html, 24 pages printed out on or about Nov. 4, 2005.

"Stress Annealing of Fe-Ga Alloys," M. Wun-Fogle, J. B. Restorff, A. E. Clark, E. Dreyer, and E. Summers, slide presentation at the Gelfanol Workshop ("Galfenol Day 2005"), University of Maryland, College Park, Feb. 1, 2005, available online at the Galfenol Workshop website, http://www.aerosmart.umd.edu/Galfenol/index.html, 20 pages printed out on or about Nov. 4, 2005.

"Effect of Cyclic Stresses and Magnetic Fields on Stress-Annealed Galfenol," Julie Slaughter, Jessi Raim, Marilyn Wun-Fogle, and James B. Restorff, slide presentation at the Galfenol Workshop ("Galfenol Day 2005"), University of Maryland, College Park, Maryland, Feb. 1, 2005, available online at the Galfenol Workshop website, http://www.aerosmart.umd.edu/Galfenol/index.html, 15 pages printed out on or about Nov. 4, 2005.

"What is Galfenol," Etrema Products website, 1 page printed out on Nov. 3, 2004 at http://etrema-usa.com/core/galfenol/.

"Patents," Etrema Products website, 3 pages printed out on Nov. 3, 2004 at http://etrema-usa.com/core/patent/.

"Active Pitch Link Phase II Award," Techno-Sciences website, article dated Jun. 9, 2004, 2 pages printed out on Nov. 3, 2004 at http://ww.technosci.com/about/news/apl_040609.php.

"Magnetostrictive Materials Background," website of the Active Materials Laboratory (AML) of the University of California, Los Angeles (UCLA), 6 pages printed out on Nov. 3, 2004 at http://aml.seas.ucla.edu/research/areas/magnetostrictive/overview.htm.

* cited by examiner

| VARIABLES | | CONSTANTS |
|---|---|---|
| $\rho$ | resistivity ($\Omega$-m) | $\rho_{FeGa} = 75 \times 10^{-8}$ $\Omega$-m<br>$\rho_{Cu} = 1.8 \times 10^{-8}$ $\Omega$-m |
| $P$ | power (W) | |
| $a$ | area (m$^2$) | |
| $R$ | resistance ($\Omega$) | |
| $F$ | force (N) | |
| $S$ | strain (unitless) | |
| $H$ | magnetic field (A/m) | |
| $S_{ms}$ | saturation magnetostrictive strain (unitless) | $S_{ms} = 300 \times 10^{-6}$ (300 ppm) |
| $I$ | current (A) | |
| $T$ | stress (N/m$^2$ or Pa) | |
| $L$ | length (m) | |
| $V$ | voltage (V) | |
| $M$ | saturation magnetization [T (tesla)] | $M = 1.7$ T |

FIG. 12

HIGH MAGNETOSTRICTION OF POSITIVE MAGNETOSTRICTIVE MATERIALS UNDER TENSILE LOAD

CROSS-REFERENCE TO RELATED APPLICATIONS

This application claims the benefit of U.S. provisional application No. 60/543,650, filed 12 Feb. 2004, hereby incorporated herein by reference, entitled "Preparation of Positive Magnetostrictive Materials for Operation under Tension," joint inventors Arthur E. Clark, James B. Restorff and Marilyn Wun-Fogle.

This application is related to U.S. nonprovisional application No. 11/007,953, filed 7 Dec. 2004, hereby incorporated herein by reference, entitled "Magnetostrictive Materials, Devices and Methods using High Magnetostriction, High Strength Fe-Ga Alloys," joint inventors Arthur E. Clark, James B. Restorff and Marilyn Wun-Fogle; which is a continuation of U.S. nonprovisional application No. 10/182,095, filed 24 Jul. 2002, hereby incorporated herein by reference, entitled "Magnetostrictive Materials, Devices and Methods using High Magnetostriction, High Strength Fe-Ga Alloys," joint inventors Arthur E. Clark, James B. Restorff and Marilyn Wun-Fogle; which claims the benefit of PCT application No. PCT/US01/02795, filed 29 Jan. 2001, hereby incorporated herein by reference, entitled "Magnetostrictive Devices and Methods using High Magnetostriction, High Strength Alloy," joint inventors Arthur E. Clark, James B. Restorff and Marilyn Wun-Fogle; which claims the benefit of U.S. provisional application No. 60/178,615, filed 28 Jan. 2000, hereby incorporated herein by reference, entitled "Strong, Ductile, and Low Field Magnetostrictive Alloys," joint inventors Arthur E. Clark, James B. Restorff and Marilyn Wun-Fogle.

This application is related to U.S. nonprovisional application No. 10/750,634, filed 24 Dec. 2003, hereby incorporated herein by reference, entitled "Magnetostrictive Materials, Devices and Methods using High Magnetostriction, High Strength Fe-Ga Alloys," joint inventors Arthur E. Clark, James B. Restorff and Marilyn Wun-Fogle; which is a continuation-in-part of the aforementioned U.S. nonprovisional application No. 10/182,095, filed 24 Jul. 2002, hereby incorporated herein by reference, entitled "Magnetostrictive Materials, Devices and Methods using High magnetostriction, High Strength Fe-Ga Alloys," joint inventors Arthur E. Clark, James B. Restorff and Marilyn Wun-Fogle.

STATEMENT OF GOVERNMENT INTEREST

The invention described herein may be manufactured and used by or for the Government of the United States of America for governmental purposes without payment of any royalties thereon or therefor.

BACKGROUND OF THE INVENTION

The present invention relates to magnetostriction, more particularly to the utilization of positive magnetostrictive materials while being subjected to mechanical stresses.

The so-called "active materials" include magnetostrictives (e.g., Terfenol-D), electrostrictives, piezoelectrics (e.g., PZT, PMN-PT), and shape memory alloys (acronym, "SMA"). Active materials are used as sensors and actuators in various devices (such as smart structures) that integrate active and passive material systems. Typically, the active material system is subjected to significant mechanical stresses during operation of the device. With the notable exception of the recently discovered Galfenol class of alloy, modern active materials (e.g., Terfenol-D, PZT, PMN-PT) are robust under compressive stress but break relatively easily when a tensile stress is applied. Iron-gallium (Fe-Ga) alloys known as "Galfenol," newly developed by the United States Navy's Naval Surface Warfare Center, Carderock Division, are materials that have large positive magnetostrictions but that are strong in both compression and tension. Certain other magnetostrictive materials, such as aluminum alloys, exhibit varying degrees of robustness in response to tensile stress; however, Galfenol is superior to all other magnetostrictive materials in this respect by at least a factor of two.

In a magnetostrictive material, the dimensions change as the material's magnetization direction varies. According to conventional practice involving magnetostriction, a magnetic field is applied to a magnetostrictive material to manipulate the material's magnetization direction. The magnetization direction tends to align itself parallel to the applied magnetic field. The magnetostrictive material acts as a transducer or motor, converting electrical to mechanical energy. A "positive" magnetostrictive material (i.e., a material that is characterized by "positive" magnetostriction) is one that, while subjected to longitudinally-axially directed compressive stress, expands (e.g., enlarges or lengthens) in the longitudinal-axial direction when then placed in a longitudinally-axially directed magnetic field created by an electrically conductive coil circumferentially circumscribing the magnetostrictive material; in the case of a positive magnetostrictive material, its magnetization shifts from transversely directed side-by-side orientation (brought about by the longitudinally-axially directed compressive stress) to longitudinally-axially directed end-to-end orientation (brought about by the longitudinally-axially directed magnetic field). A "negative" magnetostrictive material (i.e., a material that is characterized by "negative" magnetostriction) is one that, while subjected to longitudinally-axially directed tensile stress, contracts (e.g., shrinks or shortens) in the longitudinal-axial direction when then placed in a longitudinally-axially directed magnetic field created by an electrically conductive coil circumferentially circumscribing the magnetostrictive material; in the case of a negative magnetostrictive material, its magnetization shifts from transversely directed orientation (brought about by the longitudinally-axially directed tensile stress) to longitudinally directed end-to-end orientation (brought about by the longitudinally-axially directed magnetic field).

Positive magnetostriction materials are traditionally used with compressive stresses. Although heretofore unrealized, it would be desirable in many contexts to use positive magnetostriction materials with tensile stresses. The recent advent of Galfenol has whetted the technological world's appetite for such capabilities. For instance, one can contemplate various kinds of active apparatus that would prove useful in sonar, vibration damping, and other application. To achieve this goal, however, magnetic manipulation techniques commonly applied when using positive magnetostriction materials with compressive stresses would prove rather awkward to effectuate when using positive magnetostriction materials with tensile stresses.

The following references, incorporated herein by reference, are informative regarding magnetostriction in general, and Galfenol in particular. Wun-Fogle et al. U.S. Pat. No. 6,139,648 issued 31 Oct. 2000, entitled "Prestress Imposing Treatment of Magnetostrictive Material"; Wun-Fogle et al. U.S. Pat. No. 6,176,943 B1 issued 23 Jan. 2001, entitled "Processing Treatment of Amorphous Magnetostrictive Wires"; "Tensile Properties of magnetostrictive Iron-Gallium Alloys," R. A. Kellogg, A. M. Russell, T. A. Lograsso, A. B. Flatau, A. E. Clark and M. Wun-Fogle, *Acta Materialia,* vol. 52, pp 5043-5050 (available online 25 Aug. 2004 at www.sciencedirect.com); "Extraordinary Magnetoelasticity and Lattice Softening in b.c.c. Fe-Ga Alloys," A. E. Clark, K. B. Hathaway, M. Wun-Fogle, J. B. Restorff, T. A. Lograsso, V. M. Keppens, G. Petculescu, and R. A. Taylor, *Journal of Applied Physics,* vol. 93, no. 10, pp 8621-8623 (15 May 2003); "Texture and Grain Morphology Dependences of Saturation Magnetostriction in Rolled Polycrystalline $Fe_{83}Ga_{17}$," R. A. Kellogg, A. B. Flatau, A. E. Clark, M. Wun-Fogle, and T. A. Lograsso, *Journal of Applied Physics, vol,* 93, no. 10, pp 8495-8497 (15 May 2003); "Structural Transformations in Quenched Fe-Ga Alloys," T. A. Lograsso, A. R. Ross, D. L. Schlagel, A. E. Clark and M. Wun-Fogle, *Journal of Alloys and Compounds,* vol. 350, pp 95-101 (17 Feb. 2003); Magnetostrictive Properties of Galfenol Alloys under Compressive Stress," A. E. Clark, M. Wun-Fogle, J. B. Restorff, and T. A. Lograsso, *Materials Transactions,* vol. 43, no. 5, pp 881-886, The Japan Institute of Metals, Special Issue on Smart Materials—Fundamentals and Applications (2002); "Temperature and Stress Dependence of the Magnetic and Magnetostrictive Properties of $Fe_{81}Ga_{19}$," R. A. Kellogg, A. Flatau, A. E. Clark, M. Wun-Fogle and T. A. Lograsso, *Journal of Applied Physics, vol.* 91, no. 10, pp 7821-7823 (15 May 2002); "Magnetostriction of Ternary Fe-Ga-X Alloys (X=Ni, Mo, Sn, Al)," J. B. Restorff, M. Wun-Fogle, A. E. Clark, T. A. Lograsso, A. R. Ross, and D. L. Schlagel, *Journal of Applied Physics,* vol. 91, no. 10, pp 8225-8227 (15 May 2002); "Effect of Quenching on the Magnetostriction of $Fe_{1-x}Ga_x$ (0.13<x<0.21)," A. E. Clark, M. Wun-Fogle, J. B. Restorff, T. A. Lograsso and J. R. Cullen, *IEEE Transactions on Magnetics,* vol. 37, no. 4, pp 2678-2680 (July 2001); "Magnetoelasticity of Fe-Ga and Fe-Al Alloys," J. R. Cullen, A. E. Clark, M. Wun-Fogle, J. B. Restorff and T. A. Lograsso, *Journal of Magnetism and Magnetic Materials,* vols. 226-230, part 1, pp 948-949 (May 2001); "Magnetostrictive Properties of Body-Centered Cubic Fe-Ga and Fe-Ga-Al Alloys," Arthur E. Clark, James B. Restorff, Marilyn Wun-Fogle, Thomas A. Lograsso and Deborah L. Schlagel, *IEEE Transaction on Magnetics,* vol. 36, no. 5, pp 3238-3240 (September 2000); "Magnetostrictive Galfenol/Alfenol Single Crystal Alloys Under Large Compressive Stresses," A. E. Clark, M. Wun-Fogle, J. B. Restorff, and T. A. Lograsso, Proceedings of *Actuator* 2000, 7th International Conference on New Actuators, Bremen, Germany, 19-21 Jun. 2000, pp 111-115; "Strong, Ductile, and Low-Field-Magnetostrictive Alloys Based on Fe-Ga," S. Guruswamy, N. Srisukhumbowornchai, A. E. Clark, J. B. Restorff, and M. Wun-Fogle, *Scripta Materialia,* vol. 43, issue 3, pp 239-244 (20 Jul. 2000).

SUMMARY OF THE INVENTION

In view of the foregoing, it is an object of the present invention to provide method and apparatus for using a positive magnetostriction material while subjecting it to tensile stress.

According to typical inventive embodiments, a method for producing magnetostrictive contraction comprises: (a) applying longitudinally-axially directed tension to an elongate structure so that the magnetization of the elongate structure tends generally to be longitudinally-axially directed; and, (b) applying a transversely (e.g., circumferentially) directed magnetic field to the elongate structure so that the magnetization tends generally to be transversely (e.g., circumferentially or tangentially) directed. The ensuing longitudinally-axially directed magnetostrictive contraction of the elongate structure is associated with the directional change of the magnetization from the longitudinally-axially directed general tendency to the transversely (e.g., circumferentially or tangentially) directed general tendency. The production of a transversely (e.g., circumferentially or tangentially) directed magnetic field will frequently result from, according to inventive practice, at least one of the following: (1) conduction of longitudinally-axially directed electrical current through the elongate structure; (2) conduction of longitudinally-axially directed electrical current through at least one elongate electrical conductor that is placed exterior (e.g., adjacent) to the elongate structure; (3) conduction of longitudinally-axially directed electrical current through at least one elongate electrical conductor that is placed interior to (e.g., inside a longitudinal-axial bore of) the elongate structure.

The present invention represents a unique methodology for using a positive magnetostrictive material under tensile loading. The conventional methodology for operating a positive magnetostrictive material in a device involves utilization of an excitation coil so as to supply an axial magnetic field to a magnetostrictive rod (or other elongate structure). This conventional methodology does not work for positive magnetostrictive materials under tensile load, since the magnetization is often already along the axial direction. The present invention applies a transverse (e.g., circumferential or tangential) magnetic field to magnetostrictie material with respect to which tensile stress is being exerted. The generation of a transverse magnetic field is accomplished according to at least one of three inventive modes. This transverse magnetic field rotates the magnetostrictive material's magnetization from the axial direction to the transverse direction, resulting in the desired magnetostrictive effect.

To elaborate, according to inventive principles, the magnetization of the magnetostrictive material is induced by tensile stress to be directed parallel to the longitudinal axis of the magnetostrictive material. An electrical current is applied so as to create a transverse (perpendicular) magnetic field. The tensilely induced longitudinally-axially directed magnetization of the magnetostrictive material is caused—by the electrically induced transverse magnetic field (i.e., the magnetic field induced via application of electrical current)—to move (rotate) ninety degrees so as to be transversely directed because of the tendency of the magnetization to become parallel with (align with) the transverse direction of the electrically induced magnetic field. That is, the magnetization changes orientation from one of parallelness with respect to the longitudinal axis to one perpendicularity with respect to the longitudinal axis. The magnetization becomes "perpendicular" (orthogonal or normal or at right angles) to the longitudinal axis in the sense that every or nearly every magnetization vector ("magnetic moment" or "magnetic domain") shifts orientation so as to at least approximately lie in a geometric plane that perpendicularly intersects the magnetostrictive material's geometric longitudinal axis. Otherwise expressed, every or nearly every vector of magnetization shifts orientation so that the dot product between the vector of magnetization and the vector along the longitudinal axis equals or approaches zero. Expressed more simply, the magnetization becomes perpendicular to the direction of the length of the magnetostrictive material. The term "transverseness," as used herein to describe directions of physical phenomena (such as magnetic field or magnetization) that are associated with inventive practice, denotes "perpendicularity" with respect to the length of the magnetostrictive structure. For instance, a magnetic field or a magnetization that is transverse with respect to a magnetostrictive rod is perpendicular to (at right angles to) the length of the rod.

According to typical embodiments of a first inventive mode for applying a transverse magnetic field to a magnetostrictive material structure, an electric current is provided through the magnetostrictive material structure itself (thereby applying a circumferentially transverse magnetic field). According to typical embodiments of a second inventive mode for applying a transverse magnetic field to the magnetostrictive material structure, an electric current is provided through one or more low resistance wires that are situated adjacent to the inside surface or surfaces of (e.g., inserted into) one or more magnetostrictive material structures (thereby applying a circumferentially transverse magnetic field). According to typical embodiments of a third inventive mode for applying a transverse magnetic field to the magnetostrictive material structure, an electric current is provided through one or more low resistance wires that are situated adjacent to the outside surface or surfaces of one or more magnetostrictive material structures (thereby applying a tangentially transverse magnetic field). According to some inventive embodiments, two or all three inventive modes are combined for applying a transverse magnetic field to the magnetostrictive material. According to one instance of such inventive embodiments, an electric current is provided through low resistance wires situated both inside the magnetostrictive material's axial bore and outside the magnetostrictive material's exterior surface. In the light of the instant disclosure, the ordinarily skilled artisan will be capable of practicing any of multifarious embodiments of the present invention.

The present invention affords new capabilities, especially the construction of devices that operate while effecting tensional stress. Such inventive devices are useful, for example, in sonar transducers and in vibration damping of structures and machinery. The present invention admits of implementation of a variety of active, structural materials and admits of practice in a variety of technologies and applications.

Other objects, advantages and features of this invention will become apparent from the following detailed description of the invention when considered in conjunction with the accompanying drawings.

BRIEF DESCRIPTION OF THE DRAWINGS

The present invention will now be described, by way of example, with reference to the accompanying drawings, wherein:

As shown in FIG. 5, transverse magnetic field lines are generated by a current conducted through the elongate, electrically conductive, magnetostrictive structure. The transverse magnetic field lines cause the magnetization to rotate parallel to the transverse magnetic field lines.

FIG. 12 is a table defining variables and constants used in several examples, described herein, of practice in accordance with the present invention.

DETAILED DESCRIPTION OF THE INVENTION

Figure 1:
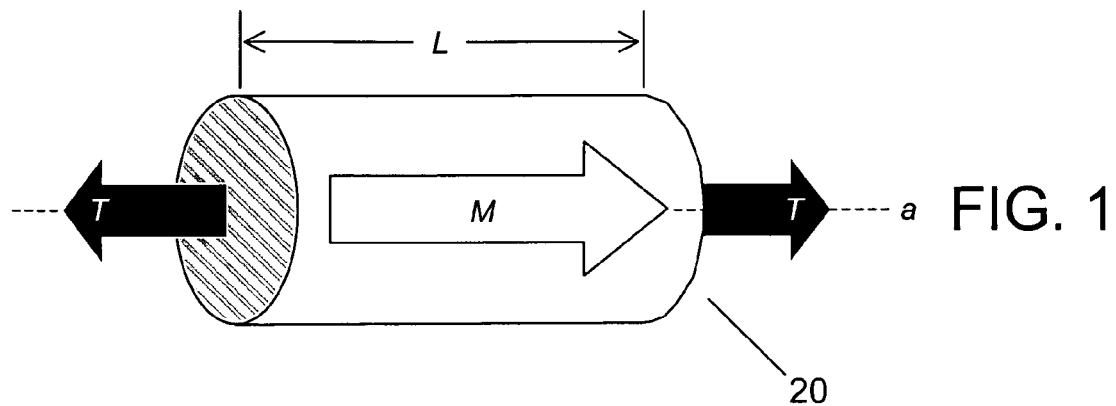
FIG. 1 is a perspective view of an elongate magnetostrictive structure, illustrating the subjection of the elongate magnetostrictive structure to longitudinal-axial tension and the consequent alignment therewith of the elongate magnetostrictive structure's magnetization.

In positive magnetostrictive materials, tensile loading (tensile stress) causes the magnetization to rotate toward the stress axis. Referring to FIG. 1, elongate magnetostrictive structure 20 is made of a positive magnetostrictive material. Although elongate magnetostrictive structure 20 is shown to be cylindrical, magnetostrictive properties have been known to manifest in non-cylindrical (e.g., prismatic) elongate shapes. In the absence of stress, elongate magnetostrictive structure 20 is characterized by directional randomization of magnetization M. When elongate magnetostrictive structure 20 is subjected to tension (tensile stress) T in the direction of its geometric longitudinal axis a, the magnetization M of elongate magnetostrictive structure 20 becomes parallel to tension T, which is coincident with geometric longitudinal axis a.

Figure 2:
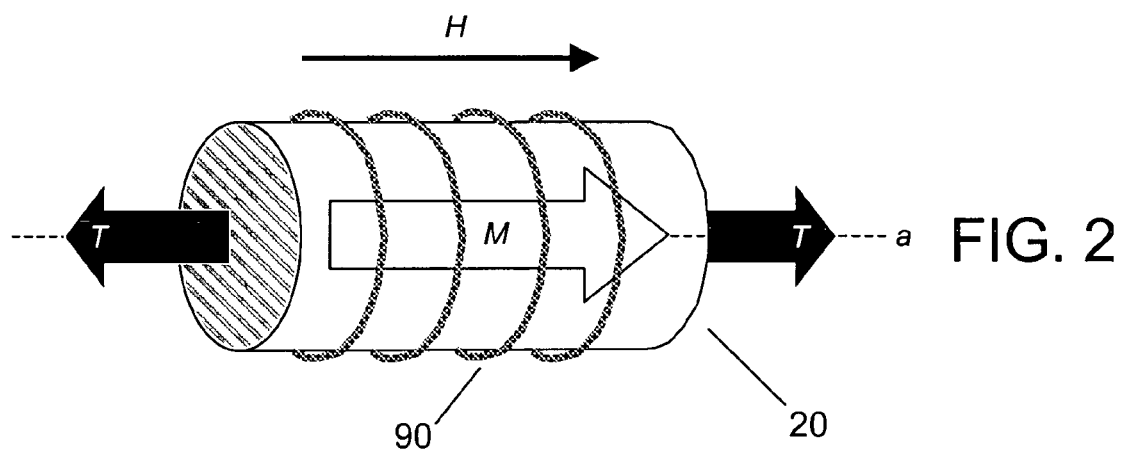
FIG. 2 is the perspective view of the elongate magnetostrictive structure shown in FIG. 1, illustrating the lack of any magnetostrictive effect associated with a current-carrying coil that is wrapped circumferentially around the elongate magnetostrictive structure, when the elongate magnetostrictive structure is subjected to longitudinal-axial tension.
Figure 3:
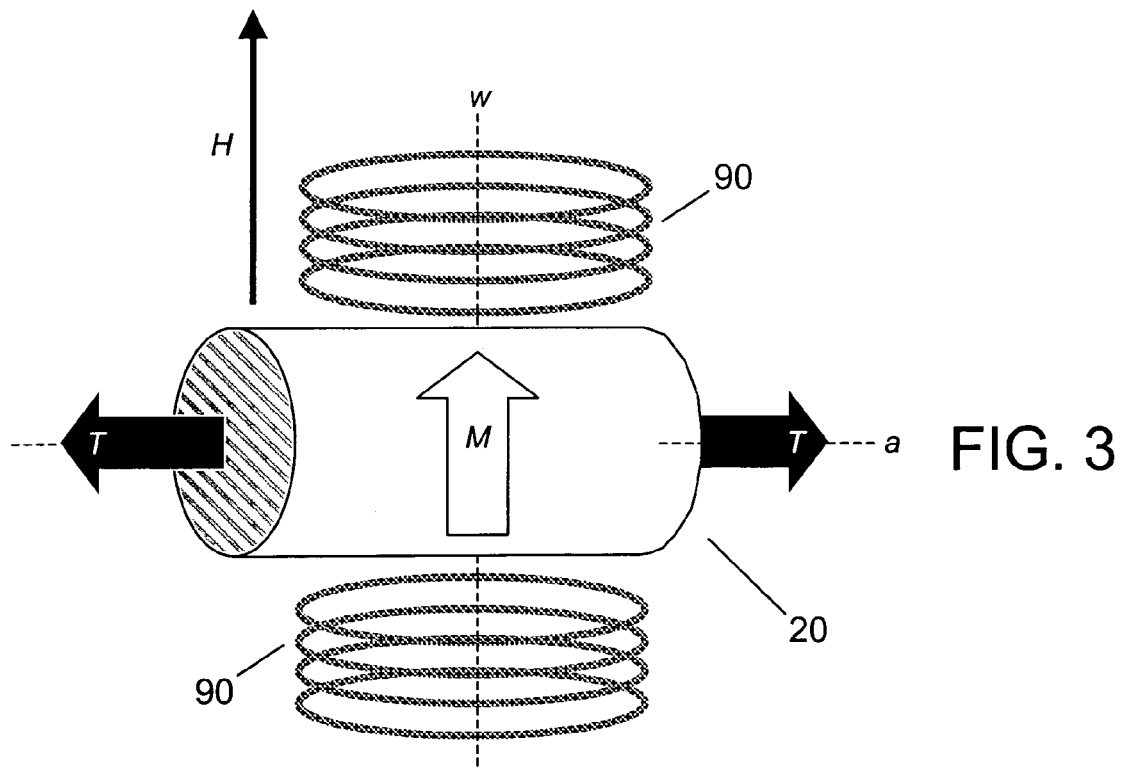
FIG. 3 is the perspective view of the elongate magnetostrictive structure shown in FIG. 1, illustrating a magnetostrictive effect associated with current that is carried by a coil that is oriented so that the coil's geometric longitudinal axis is perpendicular to the elongate magnetostrictive structure's geometric longitudinal axis, when the elongate magnetostrictive structure is subjected to longitudinal-axial tension.

FIG. 2 and FIG. 3 illustrate relationships among tensional (tensile) stress, magnetization and magnetic field direction. With reference to FIG. 2, the parallelness of the magnetization M with respect to the tension T, shown in FIG. 1, can be a counterproductive characteristic if a magnetostrictive change in length L of elongate magnetostrictive structure 20 is desired. FIG. 2 depicts a simple configuration of a current I conducted through a coil 90 that is wrapped around elongate magnetostrictive material 20. No magnetostrictive effect is brought about when a current-carrying coil 90 coaxially circumscribes elongate magnetostrictive structure 20 while elongate magnetostrictive structure 20 is being subjected to longitudinal-axial tension T. Coil 90, wrapped or wound around elongate magnetostrictive structure 20, carries electrical current I. Current I produces a magnetic field H that is parallel to the magnetization M of elongate magnetostrictive structure 20. Magnetization M is directed along longitudinal axis a because tension T is directed along longitudinal axis a. Hence, the magnetic field H thus produced does not cause a change in direction of magnetization M of elongate magnetostrictive structure 20 such as would result in a change in length L of elongate magnetostrictive structure 20.

Accordingly, as depicted in FIG. 2, current I creates a magnetic field H along the same axis, viz., longitudinal axis a, and therefore does not result in any change in the direction of magnetization M, since the magnetization M is already parallel to the magnetic field H direction. That is, FIG. 2 illustrates the non-responsiveness of the elongate magnetostrictive structure 20 material to the magnetic field H. With reference to FIG. 3, a magnetic field H applied transverse to the elongate magnetostrictive structure 20 material rotates the magnetization M and results in a change in length L. As shown in FIG. 3, current I is conducted by a coil 90. Current-carrying coil 90 is oriented so that the geometric longitudinal axis w of current-carrying coil 90 is perpendicular to the geometric longitudinal axis a of elongate magnetostrictive structure 20. Current I produces a magnetic field H that is perpendicular to magnetization M of the elongate magnetostrictive structure 20. Magnetization M is directed along longitudinal axis a because the tension T that the elongate magnetostrictive structure is experiencing is directed along longitudinal axis a. Hence, the magnetic field H thus produced causes a change in direction of magnetization M of elongate magnetostrictive structure 20 so as to be parallel to the magnetic field H. The change in direction of the magnetization M of elongate magnetostrictive structure 20 thereby results in a change in the length L of elongate magnetostrictive structure 20.

Similarly as elongate magnetostrictive structure 20 is shown to be cylindrical in FIG. 1 through FIG. 3, the inventively practiced elongate magnetostrictive structures shown herein in FIG. 4 through FIG. 11 are shown to be cylindrical. Thus, elongate magnetostrictive structure $20_c$ is shown to be cylindrical in FIG. 4 and FIG. 5; elongate annular magnetostrictive structure 200 is shown to be cylindrical in FIG. 6 and FIG. 9; elongate magnetostrictive structure 20 shown to be cylindrical in FIG. 7 and FIG. 10; magnetostrictive structure 20 is shown to be cylindrical in FIG. 8 and FIG. 11. Nevertheless, in inventive practice the elongate magnetostrictive structures are not necessarily cylindrical, albeit they are typically (but not necessarily) axially symmetrical. Magnetostrictive properties manifest analogously for cylindrical and non-cylindrical (e.g., prismatic) shapes. Generally speaking, an elongate magnetostrictive structure used in inventive practice is characterized by a shape defining the lateral surface of a "cylindric solid." A cylindric solid is a three-dimensional geometric figure that includes a lateral surface and two congruent bases lying in parallel geometric planes. Cylindric solids include, but are not limited to, cylinders (wherein the bases are circular), cylindroids (wherein the bases are elliptical), and prisms (wherein the bases are polygonal). The present invention's elongate magnetostrictive structures can be embodies, for instance, as a rod, a wire or a bar. It is to be understood that the present invention's elongate magnetostrictive structures illustrated herein in FIG. 4 through FIG. 11, though sometimes referred to herein as "wires," can be inventively practiced in multifarious forms and shapes.

Figure 4:
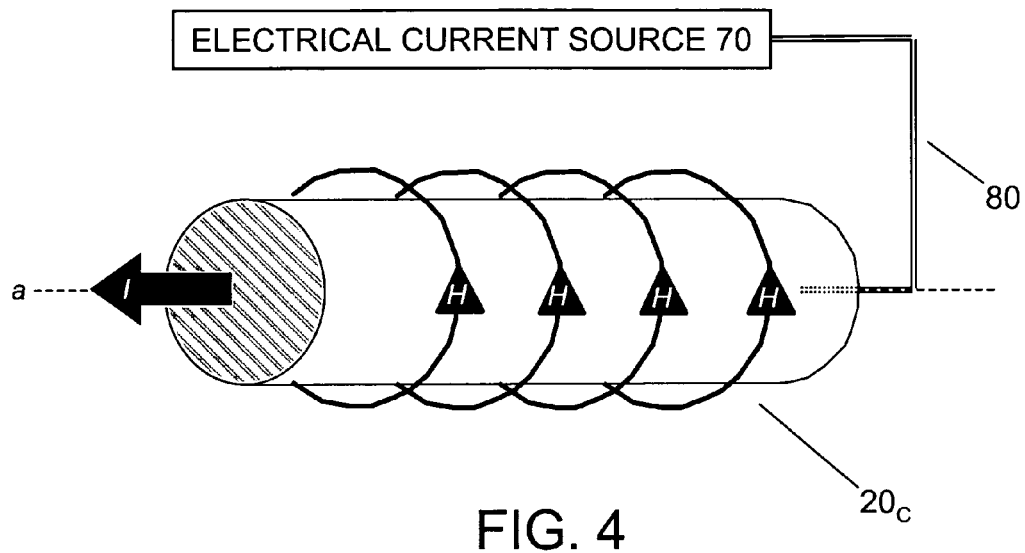
FIG. 4 is a perspective view of an electrically conductive, elongate magnetostrictive structure, cylindrically shaped similarly as shown in FIG. 1, illustrating a principle of the present invention whereby electrical current carried by the elongate magnetostrictive structure along the elongate magnetostrictive structure's geometric longitudinal axis results in a magnetic field that is circumferentially transverse relative to the elongate magnetostrictive structure's geometric longitudinal axis.
Figure 5:
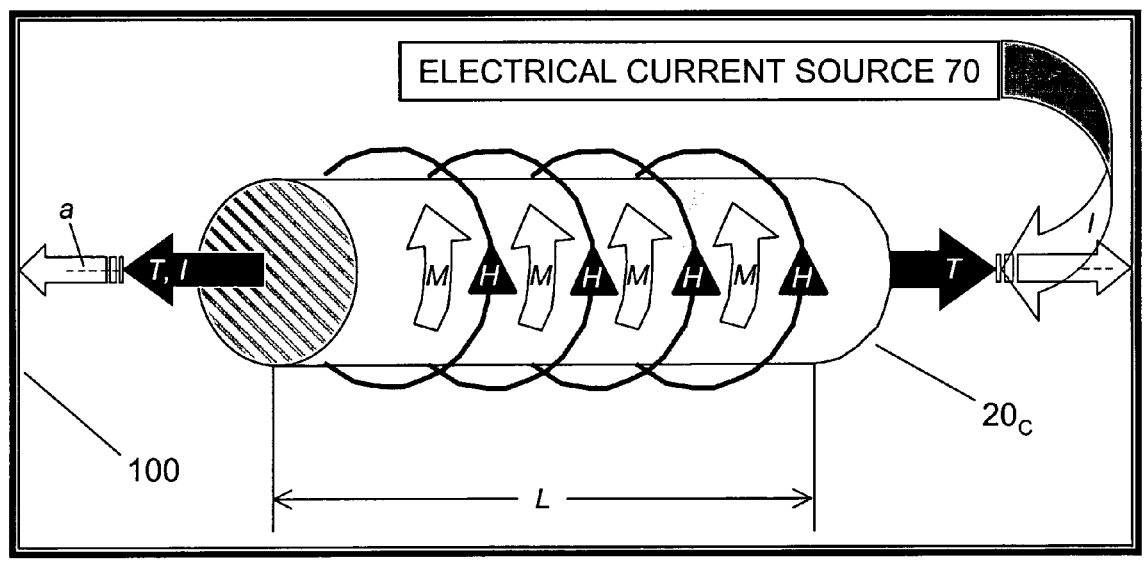
FIG. 5 is a perspective view of the elongate magnetostrictive structure shown in FIG. 4, illustrating, in accordance with an embodiment of the present invention, a magnetostrictive effect associated with current that is carried by the elongate magnetostrictive structure along the elongate magnetostrictive structure's geometric longitudinal axis such as shown in FIG. 4, when the elongate magnetostrictive structure is subjected to longitudinal-axial tension.

Referring to FIG. 4 and FIG. 5, elongate magnetostrictive structure $20_c$ conducts electrical current I along the longitudinal axis a of elongate magnetostrictive structure $20_c$. The current I is supplied by an electrical current source 70 (such as a battery or other direct current power supply device) and is conducted to elongate magnetostrictive structure $20_c$ via an electrical connection means 80 (such as a wire, lead, electrode or other electrical conductor device). Generally speaking, inventive practice similarly involves utilization of an electrical current source 70 and electrical connection means 80. As illustrated in FIG. 4, current I produces a magnetic field H that is circumferentially transverse relative to longitudinal axis a of elongate magnetostrictive structure $20_c$. That is, current I, conducted through elongate magnetostrictive structure 20, generates a transverse magnetic field H.

The elongate magnetostrictive structure $20_c$ in FIG. 4 and FIG. 5 is similar to the elongate magnetostrictive structure 20 shown in FIG. 1 through FIG. 3 insofar as having a positive magnetostrictive material composition and describing a cylindrical shape. Typical magnetostrictive structures consist of (or substantially consist of) magnetostrictive material, and are thus electrically conductive. Some magnetostrictive structures, however, are not electrically conductive, as they have a composite construction including a resinous matrix and magnetostrictive material reinforcement or filler. The elongate magnetostrictive structures that can be inventively implemented are not limited to structures having a positive magnetostrictive material composition, but can include any structure, regardless of material composition, that is capable of exhibiting positive magnetostriction.

As illustrated in FIG. 5, elongate magnetostrictive structure $20_c$ is subjected to longitudinal-axial tension (tensile stress) T. According to typical inventive practice, longitudinal-axial tensile stress T is exerted by means of attaching elongate magnetostrictive structure $20_c$ to one or more other structures, diagrammatically represented in FIG. 5 as housing 100. Such attachment can be effected by any of various known techniques for attaching metal materials to other objects. For instance, elongate magnetostrictive structure $20_c$ can be bored (e.g., drilled) at each end and the resultant holes used for fastening (e.g., screwing or bolting) to housing 100. Alternatively, elongate magnetostrictive structure $20_c$ can threaded at each end and the resultant threaded ends used for fastening (e.g., screwing or bolting) to housing 100. As another alternative, elongate magnetostrictive structure $20_c$ can be welded at each end to housing 100.

As further illustrated in FIG. 5, a magnetostrictive effect ensues when elongate magnetostrictive structure $20_c$ is subjected to longitudinal-axial tension T. The current I produces a magnetic field H that is circumferentially transverse relative to the magnetization M of elongate magnetostrictive structure $20_c$, magnetization M being directed along longitudinal axis a because of the tension T along longitudinal axis a that elongate magnetostrictive structure $20_c$ is experiencing. Hence, the magnetic field H thus produced causes a change in direction of magnetization M of elongate magnetostrictive structure $20_c$ so that magnetization M is parallel to the produced magnetic field H. The change in the direction of magnetization M of elongate magnetostrictive structure $20_c$ thereby results in a change in the length L of elongate magnetostrictive structure $20_c$.

Figure 6:
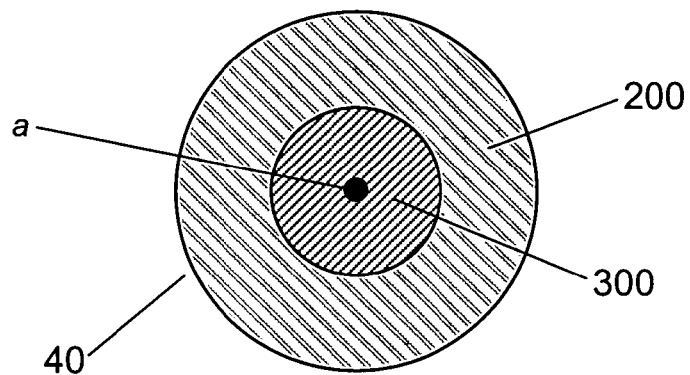
FIG. 6 is a cross-sectional or end view of the inventive embodiment shown in FIG. 9, illustrating an inventive configuration that includes an integral elongate structure having two coaxial sections, viz., (i) a solid cylindrical electrically conductive core section and (ii) a hollow cylindrical magnetostrictive annular section.
Figure 9:
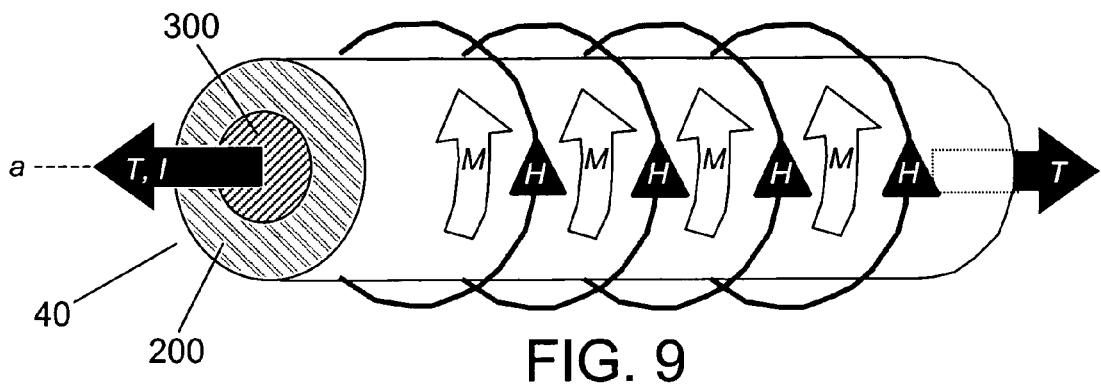
FIG. 9 is a perspective view of the inventive embodiment shown in FIG. 6, illustrating, in accordance with an embodiment of the present invention, a magnetostrictive effect associated with current that is carried by the interior, electrically conductive section of an elongate structure, when the exterior, magnetostrictive section of an elongate structure is subjected to longitudinal-axial tension.

With reference to FIG. 6 and FIG. 9, the present invention's integral elongate structure 40 includes two coaxial sections, viz., annulus 200 (the exterior, annular, magnetostrictive section) and core 300 (the interior, solid cylindrical, electrically conductive section), which share longitudinal axis a. Annulus 200 is an elongate hollow cylindrical structure. Core 300 is an elongate solid cylindrical structure. Core 300 conducts current I in the direction of longitudinal axis a. Annulus 200 is subjected to tension T along longitudinal axis a. Current I produces a magnetic field H that is perpendicular to the magnetization M of annulus 200. Magnetization M is longitudinally-axially directed because of the longitudinal-axial tension T that annulus section 200 is experiencing. Hence, the magnetic field H, produced by current I, causes a change in direction of the magnetization M of annulus 200 so that magnetization M is parallel to magnetic field H, as shown in FIG. 9. The change in the direction of magnetization M of annulus 200 thereby results in a change in length L of annulus 200.

According to generally preferred inventive practice, core 300 is detached from (e.g., slidably engages) annulus 200; thus, annulus 200 (and not necessarily core 300) is subjected to tension T along longitudinal axis a. According to some inventive embodiments, however, annulus 200 and core 300 are attached to each other; here, by virtue of the integral or coupled nature of elongate structure 40, the subjection of annulus 200 to tension T along longitudinal axis a will be accompanied by subjection of core 300 to longitudinal-axial tension. In principle, the joining of core 200 with annulus 300 might interfere somewhat with magnetostrictive change in length L of annulus 300; nevertheless, it can be expected that such resistance imparted by core 200 when annulus 300 experiences magnetostrictive contraction will usually be negligible.

Figure 7:
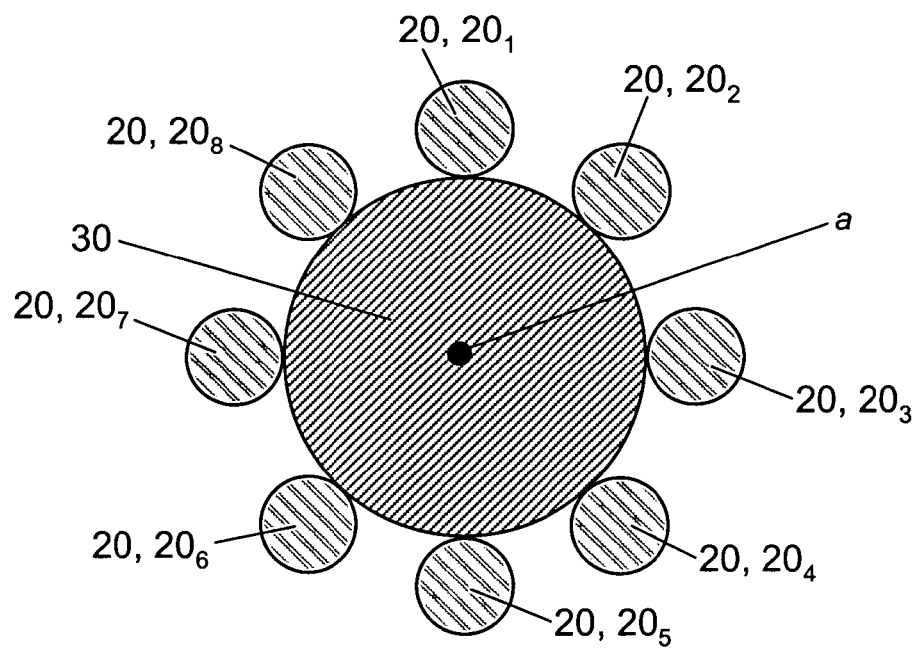
FIG. 7 is a cross-sectional or end view of the inventive embodiment shown in FIG. 10, illustrating an inventive configuration that includes a central electrically conductive elongate structure and eight peripheral symmetrically distributed magnetostrictive elongate structures.
Figure 10:
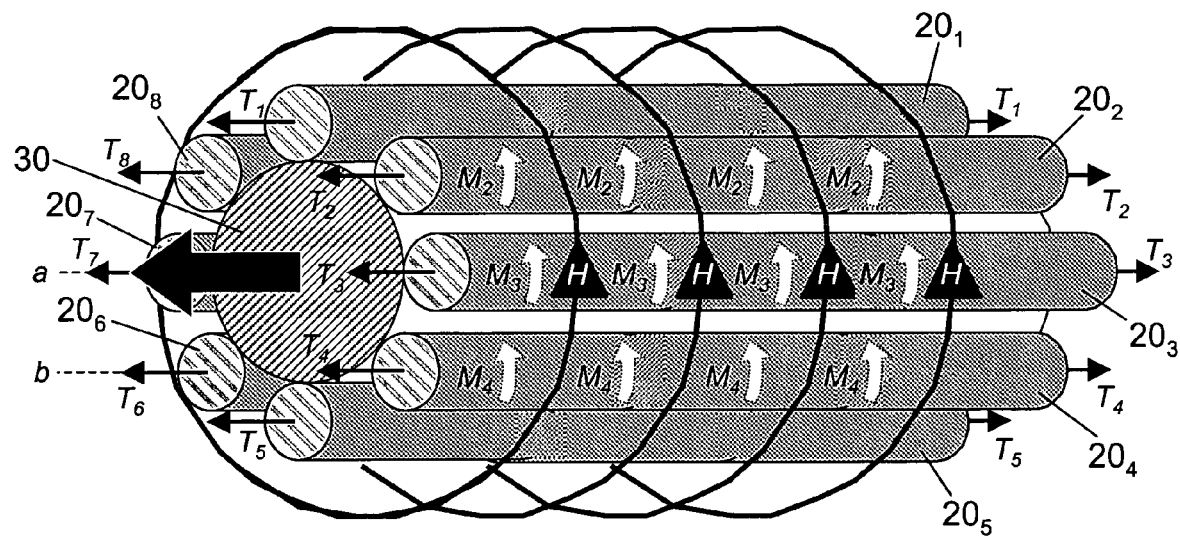
FIG. 10 is a perspective view of the inventive embodiment shown in FIG. 7, illustrating, in accordance with an embodiment of the present invention, a magnetostrictive effect associated with current that is carried by the central electrically conductive elongate structure when the eight peripheral symmetrically distributed magnetostrictive elongate structures are subjected to longitudinal-axial tension.

Now referring to FIG. 7 and FIG. 10, a current I is conducted by wire 30, which is a central, electrically conductive, elongate structure. The peripheral wires 20 ($20_1$, $20_2$, $20_3$, $20_4$, $20_5$, $20_6$, $20_7$ and $20_8$), are magnetostrictive structures that are shown to be symmetrically arranged with respect to longitudinal axis a of the central, electrically conductive wire 20. The inventive embodiment shown in FIG. 7 and FIG. 10 is similar to that shown in FIG. 6 and FIG. 9 in that the active material surrounds the current-carrying wire. However, as shown in FIG. 7 and FIG. 10 the active material is discrete, whereas as shown in FIG. 6 and FIG. 9 the active material is continuous.

Still referring to FIG. 7 and FIG. 10, each peripheral, magnetostrictive wire 20 has a longitudinal axis b and is contiguous to the central, electrically conductive wire 20 so that every longitudinal axis b of a corresponding peripheral wire 20 is parallel to longitudinal axis a of central wire 30. Each peripheral wire 20 is subjected to tension T along its longitudinal axis b. Tensions $T_1$, $T_2$, $T_3$, $T_4$, $T_5$, $T_6$, $T_7$ and $T_8$ correspond to peripheral wires $20_1$, $20_2$, $20_3$, $20_4$, $20_5$, $20_6$, $20_7$ and $20_8$, respectively. Current I is conducted by central wire 30 along its longitudinal axis a so as to produce a magnetic field H that is perpendicular to the magnetization M of each peripheral wire 20. Magnetization M is directed along each longitudinal axis b because of the tension T along longitudinal axis b that each peripheral wire 20 is experiencing. Hence, the magnetic field H produced by the current I causes a change in direction of magnetization M of each peripheral wire 20 so that magnetization M is parallel to the produced magnetic field H, as shown in FIG. 10. Although magnetizations $M_2$, $M_3$ and $M_4$, only, are indicated in FIG. 10 due to illustrative limitations, it is understood that each peripheral wire 20 has associated therewith its own magnetization M; that is, magnetizations $M_1$, $M_2$, $M_3$, $M_4$, $M_5$, $M_6$, $M_7$ and $M_8$ correspond to peripheral wires $20_1$, $20_2$, $20_3$, $20_4$, $20_5$, $20_6$, $20_7$ and $20_8$, respectively. The change in direction of magnetization M of each peripheral wire 20 thereby results in a change in length L of that peripheral wire 20.

With regard to attachment versus detachment of components of the inventive device, similar considerations apply to the inventive embodiment shown in FIG. 7 and FIG. 10 as apply to the inventive embodiment shown in FIG. 6 and FIG. 9. According to generally preferred inventive practice, central wire 30 is detached from (e.g., slidably engages) every peripheral wire 20; thus, peripheral wires 20 (and not central wire 30) are each subjected to tension T along its longitudinal axis b. According to some inventive embodiments, however, peripheral wires 20 are attached to central wire 30; here, by virtue of the attachment, the subjection of peripheral wires 20 to tension T along corresponding longitudinal axes b will be accompanied by subjection of central wire 30 to tension along longitudinal axis a. In principle, the joining of central wire 30 with peripheral wires 20 might interfere with magnetostrictive change in length L of peripheral wires 20; nevertheless, it can be expected that such resistance imparted by central wire 30 when peripheral wires 200 experience magnetostrictive contraction will usually be negligible.

Figure 8:
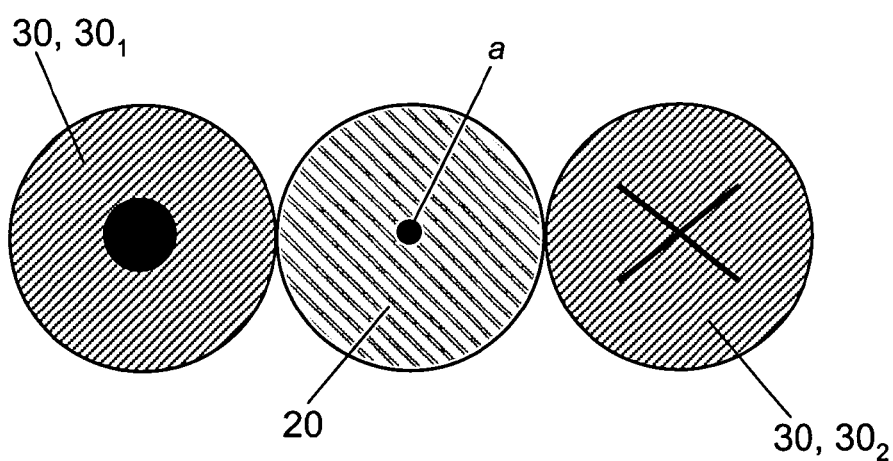
FIG. 8 is a cross-sectional or end view of the inventive embodiment shown in FIG. 11, illustrating an inventive configuration that includes a central elongate magnetostrictive structure and two peripheral (opposite) electrically conductive elongate structures that carry current in opposite directions. The righthand peripheral elongate structure conducts current in a direction shown proceeding into the page; the lefthand peripheral elongate structure conducts current in a direction shown proceeding out of the page.
Figure 11:
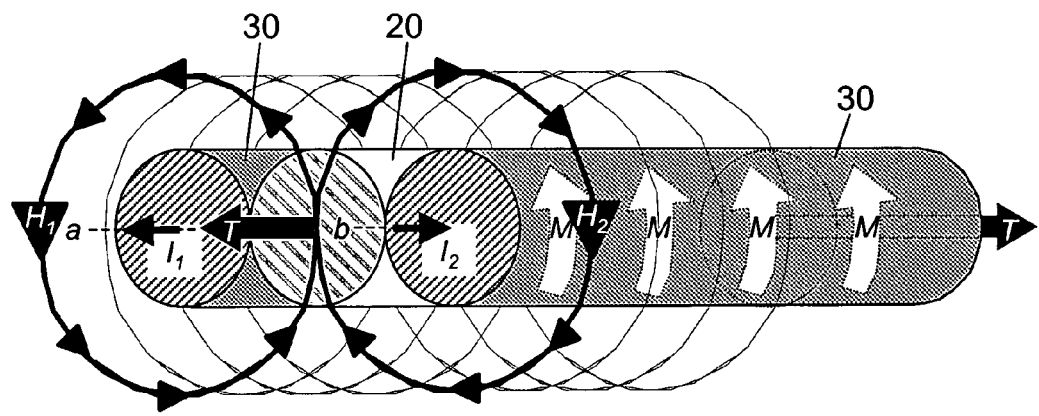
FIG. 11 is a perspective view of the inventive embodiment shown in FIG. 8, illustrating, in accordance with an embodiment of the present invention, a magnetostrictive effect associated with current that is carried in opposite directions by the two peripheral electrically conductive elongate structures, when the central elongate magnetostrictive structure is subjected to longitudinal-axial tension.

Reference now being made to FIG. 8 and FIG. 11, this inventive configuration includes a central, elongate, magnetostrictive structure (wire 20) and two peripheral, locationally opposite, electrically conductive, elongate structures (wires $30_1$ and $30_2$) that conduct electrical current I in opposite directions. The central, magnetostrictive wire 20 is symmetrically flanked by the two peripheral, electrically conductive wires 30. Currents $I_1$ and $I_2$ are conducted by peripheral wires $30_1$ and $30_2$, respectively. Each of peripheral wires $30_1$ and $30_2$ has a longitudinal axis b and is contiguous to the central wire 20 so that longitudinal axis b is parallel to longitudinal axis a of central wire 20. As shown in FIG. 8, peripheral current-carrying wire $30_1$ carries current $I_1$ out of the page, whereas peripheral current-carrying wire $30_2$ carries current $I_2$ into the page.

Still referring to FIG. 8 and FIG. 11, central, magnetostrictive, elongate structure 20 is subjected to tension T along its longitudinal axis a. Each of currents $I_1$ and $I_2$ is conducted in a direction parallel to longitudinal axis a. Currents $I_1$ and $I_2$ produce magnetic fields $H_1$ and $H_2$, respectively, each of which is perpendicular to the magnetization M of central, magnetostrictive structure 20. FIG. 11 illustrates the two parallel, counter-rotational magnetic flux patterns of magnetic field $H_1$ (which corresponds to current $I_1$) and magnetic field $H_2$ (which corresponds to current $I_2$). The overall magnetic field H=$H_1$ and $H_2$, wherein magnetic field H is perpendicular to the magnetization M of central, magnetostrictive structure 20. Magnetic field H is the sum magnetic field as manifested additively and intermediately, i.e., between current-carrying wires 30$_1$ and 30$_2$ and in the vicinity of central, magnetostrictive structure 20. Magnetization M is directed along longitudinal axis a because of the tension T along longitudinal axis a that central, magnetostrictive structure 20 is experiencing. Hence, the magnetic field H produced cumulatively by the currents I$_1$ and I$_2$ causes a change in direction of magnetization M of central, magnetostrictive structure 20 so that magnetization M is parallel to the cumulatively produced magnetic field H, as shown in FIG. 11. The change in direction of magnetization M thereby results in a change in length L of central, magnetostrictive structure 20.

Some analogies or commonalities can be noted among the various inventive embodiments shown in FIG. 6 through FIG. 11. The inventive embodiment shown in FIG. 8 and FIG. 11 is similar to that shown in FIG. 7 and FIG. 10 in that there are two or more discrete elongate structures proximately situated with corresponding geometric axes in parallel; at least one structure is made of active material, and at least one other structure is made of electrically conductive material. As a general rule the elongate structures need not be actually touching, but according to usual inventive practice the elongate structures are at least close in space. Further, the inventive embodiment shown in FIG. 6 and FIG. 9 is similar to that shown in FIG. 7 and FIG. 10 in that active material surrounds electrically conductive material; however, as shown in FIG. 7 and FIG. 10 the active material is discrete, whereas as shown in FIG. 6 and FIG. 9 the active material is continuous. Moreover, the inventive embodiment shown in FIG. 6 and FIG. 9 is similar to those shown in FIG. 7 and FIG. 10 and in FIG. 8 and FIG. 11 in that two or more discrete elongate structures (at least one structure made of active material, and at least one other structure made of electrically conductive material) are proximately situated, a main difference being that according to the inventive embodiment shown in FIG. 6 and FIG. 9 the corresponding geometric axes are coincident, whereas according to the inventive embodiments shown in FIG. 6 and FIG. 9 and in FIG. 7 and FIG. 10 the corresponding geometric axes are parallel. Again, inventive practice generally provides for nearness or contiguousness of a magnetostrictive structure with respect to an electrically conductive structure, but actual contact therebetween is generally not an inventive requirement. The present invention's individual components typically adjoin one another but, generally speaking, need not actually contact one another. Furthermore, although the inventive embodiments shown in FIG. 6 through FIG. 11 are characterized by symmetry, this is generally not a requirement of inventive practice.

It is to be understood that the present invention can be practiced with practically any number of (one or plural) active material structures and practically any number of (one or plural) electrically conductive material structures. For instance, a plurality of elongate magnetostrictive structure 20$_c$ can be inventively implemented similarly as shown in FIG. 4 and FIG. 5. As another example, a plurality of integral elongate structures 40 can be inventively implemented similarly as shown in FIG. 6 and FIG. 9. As a further example, one, or fewer than eight, or more than eight, elongate magnetostrictive structures 20 can be inventively implemented similarly as shown in FIG. 7 and FIG. 10. As another example, a plurality of elongate magnetostrictive structures 20 can be inventively implemented, each similarly as shown in FIG. 7 and FIG. 10, each elongate magnetostrictive structure 20 having associated therewith any number of elongate electrically conductive structures 30. As yet another example, a plurality of elongate magnetostrictive structures 20 can be inventively implemented, each similarly as shown in FIG. 8 and FIG. 11, each elongate magnetostrictive structure 20 having associated therewith on opposite sides a pair of elongate electrically conductive structures 30 conducting electrical current in opposite directions.

The following numerical examples of inventive practice are explained with reference to FIG. 12 and other, specified figures presented herein. SI units (metric units in accordance with the International System of Units) are used in these examples. As demonstrated by each example, using a ten (10) meter length of magnetostrictive material characterized by a magnetostriction of three hundred parts per million (300 ppm), which is typical of Fe$_{81}$Ga$_{19}$ alloys, a length change of three millimeters (3 mm) is expected as the voltage is applied. Variables and constants used in the calculations are listed in FIG. 12. The resistance R of a wire is calculated by $$R = \frac{\rho L}{A}$$

The magnetic field at a radius r enclosing a current I is given by $$H = \frac{I}{2\pi r}$$

EXAMPLE 1

With reference to FIG. 4 and FIG. 5, in this example the voltage is applied directly to the magnetostrictive material 20$_c$. A load of 40 lb=178 N is applied to a magnetostrictive, electrically conductive wire 20$_c$ of single crystal (or highly textured) Fe$_{81}$Ga$_{19}$ that is 3 mm (~⅛ inch) in diameter and 10 meters in length. To calculate the cross-sectional area a of magnetostrictive wire 20$_c$, a=$\pi r^2$=7.07×10$^{-6}$ m$^2$. The resistance R of Fe$_{81}$Ga$_{19}$ wire=$\rho$=10 m/a=1.06 Ω. Force F=178 N. The tensile stress T=25.2 MPa. Setting the magnetic and mechanical energies equal, the following equation obtains: M×H=T×S$_{ms}$. The magnetic field needed, H$_{av}$, is calculated as follows: H$_{av}$=25.2×10$^6$ Pa×300×10$^{-6}$/1.7 T=4450 A/m. The magnetic field at the surface, H$_{surface}$, is assumed to be ≅1.2>H$_{av}$=5340 A/m. The current needed is calculated as follows: I=5340 A/m×$\pi$0.3×10$^{-2}$ m=50.3 A. Voltage V=IR=50.3 A×1.06 Ω=53.3 V. Power P=VI=53.3 V×50.3 A=2680 W. Thus, in this case of a small diameter (3 mm), 10 meter Fe$_{81}$Ga$_{19}$ wire 20$_c$, subjection of wire 20$_c$ to a 40 lb tensile load, and application of a voltage of ~53.3 V to wire 20$_c$, result in a 3 mm contraction of wire 20$_c$.

EXAMPLE 2

With reference to FIG. 6 and FIG. 9, in this example a load of 40 lb=178 N is applied to the present invention's integral configuration 40, a cable-like structure that includes a Cu wire core 300 (1.5 mm in diameter) and, surrounding Cu wire 300, a magnetostrictive ring (annulus) 200 (10 meters in length, 3 mm in diameter) made of Fe$_{81}$Ga$_{19}$ textured magnetostrictive alloy. Core 300 has a radium of r$_{in}$; annulus 200 has a radius of r$_{out}$. The cross-sectional area a of the annular active material 200 is calculated as a=$\pi(r_{out}^2-r_{in}^2)$=5.3×10$^{-6}$ m$^2$. The resistance R of the Cu wire is calculated as R=0.102 Ω. The force F=178 N. The tensile stress T=33.6 MPa. Setting the magnetic and mechanical energies equal, the following equation obtains: M×H=T×S$_{ms}$. Magnetic field H$_{av}$, the magnetic field needed in the Fe$_{81}$Ga$_{19}$ ring 200, is calculated as follows: H$_{av}$=33.6×10$^6$ Pa×300×10$^{-6}$/1.7=5930 A/m=74.2 Oe. To achieve this, magnetic field H$_{surface}$, the magnetic field at the surface of the copper wire core 300, is assumed to be ≅1.5×H$_{av}$=8900 A/m. The current needed is calculated as follows: I=H$_{surface}$×π×r$_{out}$=8900 A/m×π×0.0015 m=41.9 A. Voltage V=IR=41.9 A×0.102 Ω=4.27 V. Power P=VI=4.27 V×41.9 A=179 W. It is seen that, as compared with Example 1, in Example 2 a much smaller voltage V and power P are necessary for electrifying the Cu core 300 of the inventive cable 40. Generally speaking, the present invention's heterogeneous (combining an electrically conductive core material and a magnetostrictive annular material) embodiments such as shown in FIG. 6 and FIG. 9 will require significantly less voltage and significantly less power than will the present invention's homogenous (a uniformly magnetostrictive material) embodiments such as shown in FIG. 4 and FIG. 5.

EXAMPLE 3

Still with reference to FIG. 6 and FIG. 9, in this example the Cu wire 300 and the Fe$_{81}$Ga$_{19}$ annulus 200 each have twice the diameter as in Example 2. In addition, in this example a larger load of 100 lb=445 N is applied to the present invention's integral configuration 40, which includes Cu core 300 (3 mm in diameter) and Fe$_{81}$Ga$_{19}$ annulus 200 (10 meters in length, 6 mm in diameter). The cross-sectional area a of the annular active material 200 is calculated as a=π(r$_{out}^2$−r$_{in}^2$)= 2.12×10$^{-5}$ m$^2$. The resistance R of the Cu wire is calculated as R=0.0255 Ω. The force F=445 N. The tensile stress T=21 MPa. Setting the magnetic and mechanical energies equal, the following equation obtains: M×H=T×S$_{ms}$. Magnetic field H$_{av}$, the magnetic field needed in the Fe$_{81}$Ga$_{19}$ ring 200, is calculated as follows: H$_{av}$=21×10$^6$ Pa×300×10$^{-6}$/1.7 T=3710 A/m=46.6 Oe. To achieve this, magnetic field H$_{surface}$, the magnetic field at the surface of the copper wire core 300, is assumed to be ≅1.5×H$_{av}$=5570 A/m. The current needed is calculated as follows: I=H$_{surface}$×π×r$_{out}$=5570 A/m×π×0.003 m=52.5 A. Voltage V=IR=52.5 A×0.0255 Ω=1.33 V. Power P=VI=1.33 V×52.5 A=69.8 W. Thus, in this case of a 10 meter cable 40, subjection of cable 40 to a 100 lb tensile load, and application of a voltage of ~1.33 V to copper wire 300, result in a 3 mm contraction of Fe$_{81}$Ga$_{19}$ annulus 200. Here, in this case of a 6 mm diameter, 10 meter length cable 40, cable 40 will contract 3 mm under a tensile load of 100 lb. Note that, in this example as compared with Example 2 (which involves diameter half as large), the force F is much larger and the power P requirement is much smaller. However, here the amount of Fe$_{81}$Ga$_{19}$ material is greater.

The present invention is not to be limited by the embodiments described or illustrated herein, which are given by way of example and not of limitation. Other embodiments of the present invention will be apparent to those skilled in the art from a consideration of this disclosure or from practice of the present invention disclosed herein. Various omissions, modifications and changes to the principles disclosed herein may be made by one skilled in the art without departing from the true scope and spirit of the present invention, which is indicated by the following claims.

What is claimed is:

1. A method for producing magnetostrictive contraction, the method comprising:
    applying longitudinally-axially directed tension to an elongate structure so that the magnetization of said elongate structure tends generally to be longitudinally-axially directed, said elongate structure being characterized by an elongate structure longitudinal axis;
    while said longitudinally-axially directed tension is being applied to said elongate structure, applying a transversely directed magnetic field to said elongate structure so that said magnetization tends generally to be transversely directed, said transverse direction being relative to said longitudinal-axial direction;
    said applying of said transversely directed magnetic field including conducting longitudinally-axially directed electrical current through at least one elongate electrical conductor, each said elongate electrical conductor being characterized by an elongate electrical conductor longitudinal axis, each said elongate electrical conductor being placed so that:
        said elongate electrical conductor is one of exterior to said elongate structure and interior to said elongate structure;
        said elongate electrical conductor longitudinal axis is one of parallel to said elongate structure longitudinal axis and coincident with said elongate structure longitudinal axis;
    wherein longitudinally-axially directed magnetostrictive contraction of said elongate structure is associated with the directional change of said magnetization from said longitudinally-axially directed general tendency to said transversely directed general tendency.

2. The method of claim 1, wherein said at least one elongate electrical conductor includes at least one said elongate electrical conductor that is exterior to said elongate structure and that is characterized by a said elongate electrical conductor longitudinal axis that is parallel to said elongate structure longitudinal axis.

3. The method of claim 1, wherein said at least one elongate electrical conductor includes an elongate electrical conductor that is interior to said elongate structure and that is characterized by a said elongate electrical conductor longitudinal axis that is coincident with said elongate structure longitudinal axis.

4. The method of claim 1, wherein said at least one elongate electrical conductor includes at least one pair of said elongate electrical conductors that are each exterior to said elongate structure and that are each characterized by a said elongate electrical conductor longitudinal axis that is parallel to said elongate structure longitudinal axis, each said pair of said elongate electrical conductors being situated on opposite sides of said elongate structure and conducting said longitudinally-axially directed electrical current in opposite directions.

5. A method for effecting magnetostriction of an elongate magnetostrictive structure characterized by magnetization and a geometric longitudinal axis, the method comprising:
    subjecting said elongate magnetostrictive structure to tensile stress along said geometric longitudinal axis so as to cause at least substantially all of the magnetization characterizing said elongate magnetostrictive structure to have an orientation at least approximately parallel with respect to the direction of said geometric longitudinal axis;
    generating a magnetic field so as to cause at least substantially all of said magnetization characterizing said elongate magnetostrictive structure to have an orientation at least approximately parallel with respect to the direction of said magnetic field, at least substantially all of said magnetic field being at least approximately transverse with respect to the direction of said geometric longitudinal axis, said generating of said magnetic field being performed during a period in which said elongate magnetostrictive structure is being subjected to said tensile stress, said generating of said magnetic field thereby resulting in an at least approximately perpendicular shift in said orientation, said at least approximately perpendicular shift in said orientation being accompanied by magnetostrictive contraction of said elongate magnetostrictive structure, said magnetostrictive contraction of said elongate magnetostrictive structure being in the direction of said geometric longitudinal axis, wherein said generating of said magnetic field includes:
- situating at least one elongate electrically conductive structure proximate said elongate magnetostrictive structure, each said elongate electrically conductive structure being characterized by a geometric electrically conductive longitudinal axis, each said geometric electrically conductive longitudinal axis being at least approximately parallel to said geometric longitudinal axis; and
- conducting electrical current through said at least one elongate electrically conductive structure.

6. The method of claim 5, wherein:
said situating includes situating a pair of said elongate electrically conductive structures on opposite sides of said elongate magnetostrictive structures;
said conducting includes conducting electrical current in opposite directions through said pair of elongate electrically conductive structures.

7. A method for effecting magnetostriction of an elongate magnetostrictive structure characterized by magnetization and a geometric longitudinal axis, the method comprising:
subjecting said elongate magnetostrictive structure to tensile stress along said geometric longitudinal axis so as to cause at least substantially all of the magnetization characterizing said elongate magnetostrictive structure to have an orientation at least approximately parallel with respect to the direction of said geometric longitudinal axis;
generating a magnetic field so as to cause at least substantially all of said magnetization characterizing said elongate magnetostrictive structure to have an orientation at least approximately parallel with respect to the direction of said magnetic field, at least substantially all of said magnetic field being at least approximately transverse with respect to the direction of said geometric longitudinal axis, said generating of said magnetic field being performed during a period in which said elongate magnetostrictive structure is being subjected to said tensile stress, said generating of said magnetic field thereby resulting in an at least approximately perpendicular shift in said orientation, said at least approximately perpendicular shift in said orientation being accompanied by magnetostrictive contraction of said elongate magnetostrictive structure, said magnetostrictive contraction of said elongate magnetostrictive structure being in the direction of said geometric longitudinal axis, wherein said elongate magnetostrictive structure is hollow, and wherein said generating of said magnetic field includes:
- situating at least one elongate electrically conductive structure inside said elongate magnetostrictive structure, each said elongate electrically conductive structure being characterized by a geometric electrically conductive longitudinal axis, each said geometric electrically conductive longitudinal axis being one of (i) at least approximately parallel to said geometric longitudinal axis and (ii) at least approximately coincident with said geometric longitudinal axis; and
- conducting electrical current through said at least one elongate electrically conductive structure.

8. The method of claim 7, wherein a said elongate electrically conductive structure situated inside said elongate magnetostrictive structure is characterized by a said geometric electrically conductive longitudinal axis that is at least approximately coincident with said geometric longitudinal axis.

* * * * *